United States Patent [19]

Lavene

[11] Patent Number: 4,980,798
[45] Date of Patent: Dec. 25, 1990

[54] CUFFED TAPE WRAP AND FILL WOUND CAPACITOR

[75] Inventor: Bernard Lavene, Ocean, N.J.

[73] Assignee: Electronic Concepts, Inc., Eatontown, N.J.

[21] Appl. No.: 453,676

[22] Filed: Dec. 20, 1989

[51] Int. Cl.⁵ .................... H01G 4/18; H01G 1/14; H05K 1/16
[52] U.S. Cl. ................................. 361/309; 29/25.42; 361/402
[58] Field of Search ................... 29/25, 42; 361/400, 361/402, 303–305, 310–313, 323, 324

[56] References Cited

U.S. PATENT DOCUMENTS

| | | | |
|---|---|---|---|
| 2,305,849 | 12/1942 | Dorn | 361/304 |
| 2,590,650 | 3/1952 | Robinson et al. | 29/25.42 X |
| 3,012,176 | 12/1961 | Williams et al. | 361/313 |
| 3,215,909 | 11/1965 | Schill et al. | 361/323 |
| 3,482,154 | 12/1969 | Robinson | 29/25.42 X |
| 3,891,901 | 6/1975 | Booe et al. | 361/308 |
| 3,917,986 | 11/1975 | Rice et al. | 361/306 X |
| 4,603,373 | 7/1986 | Lavene | 361/306 |

Primary Examiner—Donald A. Griffin
Attorney, Agent, or Firm—Ratner & Prestia

[57] ABSTRACT

A wrap and fill capacitor having a cuffed tape outer wrapping is provided. The cuff comprises a thin conductive foil folded about the edges of a high temperature resistant dielectric tape. The device is particularly suited for surface mounting.

7 Claims, 1 Drawing Sheet

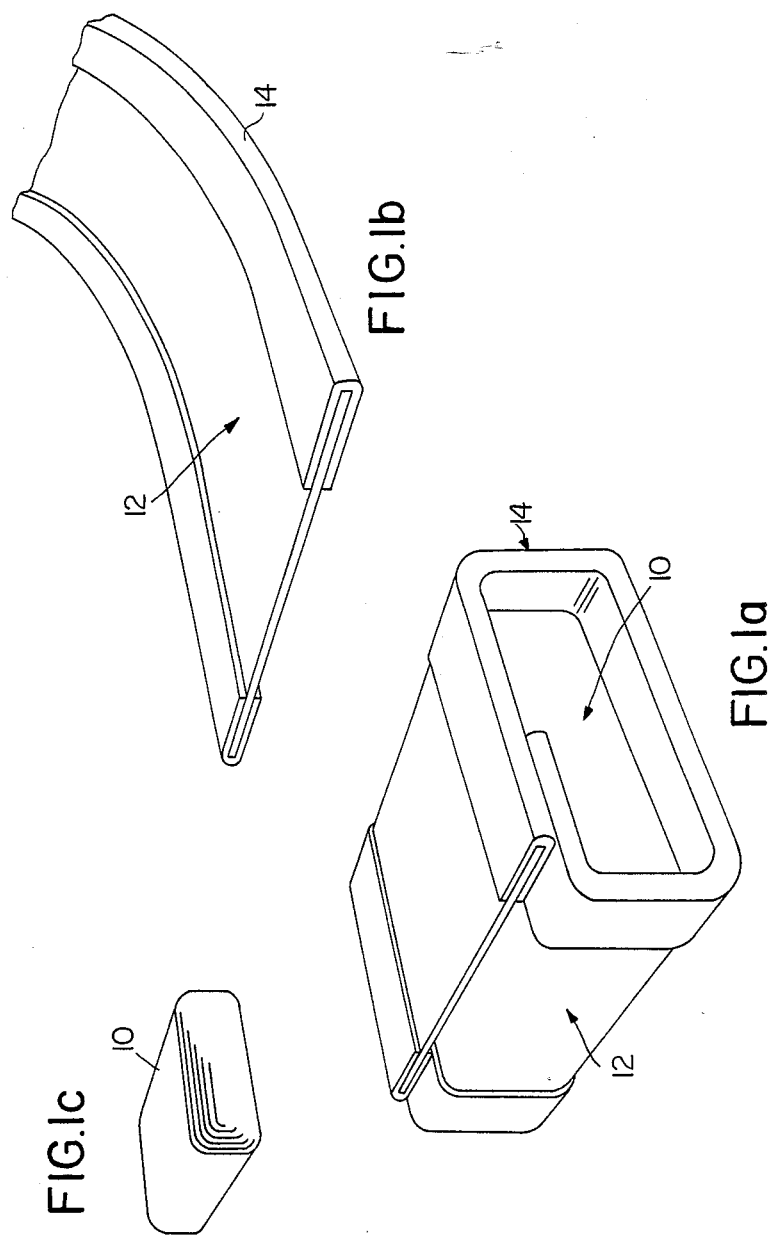

CUFFED TAPE WRAP AND FILL WOUND CAPACITOR

FIELD OF THE INVENTION

This invention relates to wrap and fill capacitors, particularly to surface mount wrap and fill capacitors.

DESCRIPTION OF RELATED ART

Direct mounting of electrical components, such as capacitors, is widely practiced in the production of high density electronic packages. Connections to a circuit board are made by reflow soldering or similar means. Generally, the component has been required to have external terminal leads in order to provide a multiplicity of such components on a board to achieve the desired package density and compatibility with other components. Previous methods of surface mounting wound capacitors are deficient both for relatively high costs and the presence of the protruding terminal leads. Further, many applications involved exposure of the element to environmental stresses which severely strained the element.

U.S. Pat. No. 4,603,373 discloses a metallized wound capacitor in which first and second elongated dielectric webs are convolutely arranged in a capacitor roll. A third dielectric web is wound about the capacitor roll to form a protective wrap. The third web has a first and a second metallic foil band secured to the side of the third web remote from the capacitor roll and each band is disposed adjacent a respective end of the roll. The bands serve as terminals which may be electrically connected to a circuit board. Although this construction offers many advantages, it is not amenable to sealing and, therefore, has limited utility.

SUMMARY OF THE INVENTION

A wrap and fill capacitor having a cuffed tape outer wrapping is provided. The cuff comprises a thin conductive foil folded about the sides of a high temperature resistant dielectric tape. The device is particularly suited for surface mounting.

BRIEF DESCRIPTION OF THE DRAWINGS

FIG. 1a is a perspective view of an unsealed capacitor element having a thin conductive foil cuff tape wrap.

FIG. 1b is a view of the tape with the cuff prior to wrapping around the capacitor winding.

FIG. 1c is typical capacitor winding.

DESCRIPTION OF THE PREFERRED EMBODIMENTS

Referring now to FIG. 1a, the capacitor of this invention comprises a pressed capacitor winding 10 wrapped with a high temperature resistant tape 12 having conductive foil cuffs 14.

The capacitor winding is prepared by methods known to those skilled in the art, typically from strips or webs of a dielectric having electrically conductive material disposed thereon. Usually, two or more such webs are wound together with a layer of dielectric between the conductive layers to insulate the electrodes from each other. Optionally, the capacitor winding may be pressed into some desired shape. Various methods of fabrication and types of materials may be employed in the manufacture of capacitor windings and this invention is not limited to any specific winding technology.

Referring now to FIG. 1b, the high temperature resistant tape 12 is illustrated with conductive cuffs 14 prior to wrapping. The tape is prepared from a high temperature resistant material, such as a polyamide. A preferred polyamide tape is that sold by Dupont under the mark Kapton polyamide. Adhesive is applied to the region of the tape between the cuffs to bond the tape to the capacitor winding. The adhesive may be a pressure sensitive adhesive or a hot melt adhesive. Optionally, adhesive is applied to the interior of the cuff surface to improve the adhesion of the cuff to the tape. There is, however, no adhesive on the exterior surfaces of the cuff. The cuff may be prepared from any flexible conductive material. Metal foil, such as copper or tin-copper foil is preferred. It is not necessary that the cuff be symmetrically disposed about the edges of the tape.

The width of the capacitor winding 10 is such as to fit between foil cuffs 14. After wrapping the capacitor winding with the cuffed tape, the recessed ends of the winding are sprayed with a zinc/tin alloy. The entire device is masked before spraying so as to avoid overspraying the exterior of the device. The spray provides electrical contact between the capacitor winding and the cuff. The ends are then sealed with an appropriate sealing means, such as a high temperature epoxy or silicon resin. The device is then tin zippered to bond the copper to itself and the copper is tin plated. The fully assembled element is thus a sealed capacitor having integrated electrodes, ideally suited for surface mounting.

In one embodiment 0.5 mil thick Cu foil was formed into cuffs extending 1/16 inch around both edges of a $\frac{3}{8}$ inch wide, 1 mil thick Kapton polyamide tape having a pressure sensitive adhesive on the tape surface (Permacel 221 tape). A $\frac{1}{4}$ inch capacitor winding was then wrapped with $1\frac{1}{2}$ turns of this tape and the element finished. It is envisioned that this process can be performed continuously with the capacitor winding moving directly to the tape wrapping step.

Although the present invention has been described with reference to particular embodiments, this description should not be construed as placing any undue limitations on the invention as claimed herein.

What is claimed is:

1. A wrap and fill capacitor comprising a capacitor winding, a thermally and electrically insulating tape wrapped around and adhered to said capacitor winding, both edges of said tape extending beyond the edges of said winding, thereby creating opposed recesses, said tape having thin conductive cuffs folded over both edges of said tape, each cuff partially covering both sides of said tape, said capacitor winding seated in the space between the cuffs, conductive material partially filling the recesses, and means for sealing the ends.

2. A capacitor of claim 1 in which said thermally and electrically insulating tape is a polyamide tape.

3. A capacitor of claim 1 in which the conductive cuff comprises metal foil.

4. A capacitor of claim 1 in which the conductive material filling the recess is a zinc-tin alloy.

5. A capacitor of claim 1 in which the means for sealing is a high temperature epoxy or silicon resin.

6. A capacitor of claim 1 in which the tape is adhesively attached to the pressed winding.

7. A method for fabricating a wrap and fill capacitor comprising:

a. coating a dielectric tape with an adhesive;
b. fitting conductive cuffs on both edges of said tape, said cuffs partially covering both sides of said tape;
c. preparing a capacitor winding of a size to fit between the cuffs on said tape;
d. wrapping said winding with the cuffed dielectric tape, thereby providing a wrapped capacitor element having recesses at both ends;
e. partially filling said recesses with a conductive material;
f. sealing the partially filled recesses; and
g. soldering and plating the conductive cuffs.

* * * * *